United States Patent
Kim et al.

(10) Patent No.: US 7,038,644 B2
(45) Date of Patent: May 2, 2006

(54) APPARATUS FOR APPLYING OFF-STATE STRESS TO P-MOS DEVICE

(75) Inventors: Byeong-Koo Kim, Gumi-si (KR); Hun Jeoung, Gumi-si (KR)

(73) Assignee: LG.Philips LCD Co., Ltd., Seoul (KR)

( * ) Notice: Subject to any disclaimer, the term of this patent is extended or adjusted under 35 U.S.C. 154(b) by 474 days.

(21) Appl. No.: 10/603,661

(22) Filed: Jun. 26, 2003

(65) Prior Publication Data

US 2004/0061674 A1    Apr. 1, 2004

(30) Foreign Application Priority Data

Sep. 26, 2002    (KR)    ............ 10-2002-0058286

(51) Int. Cl.
G09G 3/36    (2006.01)
G09G 5/00    (2006.01)

(52) U.S. Cl. ............ 345/87; 345/92; 345/93; 345/95; 345/99; 345/102; 345/211; 345/212

(58) Field of Classification Search ........ 345/87–103, 345/204–215
See application file for complete search history.

(56) References Cited

U.S. PATENT DOCUMENTS

| | | | | |
|---|---|---|---|---|
| 5,995,073 A | * | 11/1999 | Isami et al. | 345/89 |
| 6,115,017 A | * | 9/2000 | Mikami et al. | 345/92 |
| 6,118,221 A | * | 9/2000 | Kumasaka et al. | 315/209 PZ |

* cited by examiner

*Primary Examiner*—Vijay Shankar
(74) *Attorney, Agent, or Firm*—McKenna Long & Aldridge LLP

(57) ABSTRACT

An apparatus for applying an OFF-state stress to a P-MOS device of one of an array substrate for an LCD device and an LCD panel having attached substrates includes: a power supply unit supplies a source power; a panel loading unit including a plurality of panel jigs on which one of the array substrate and the LCD panel is loaded; a voltage control unit including a plurality of voltage control channels and modulating a voltage of the source power; a frequency control unit including a plurality of frequency control channels and modulating a frequency of the source power; a time setting unit determining a time period of supplying the source power; and a panel selecting unit including a plurality of panel selecting channels and modulating an application of the source power.

19 Claims, 10 Drawing Sheets

APPARATUS FOR APPLYING OFF-STATE STRESS TO P-MOS DEVICE

This application claims the benefit of Korean Patent Application No. 2002-58286, filed on Sep. 26, 2002, which is hereby incorporated by reference for all purposes as if fully set forth herein.

BACKGROUND OF THE INVENTION

1. Field of the Invention

The present invention relates to a polycrystalline thin film transistor liquid crystal display device, and more particularly, to an apparatus for applying an OFF-state stress to a p-type polycrystalline thin film transistor for stabilization.

2. Discussion of the Related Art

Until recently, cathode-ray tubes (CRTs) have generally been used for display systems. However, use of flat panel displays is becoming increasingly common because of their small depth, low weight, and low power consumption. Presently, thin-film transistor-liquid crystal displays (TFT-LCDs) are being developed that have high resolution, small depth and high color reproducibility.

When a pixel is turned on by a switching element, the pixel transmits light from a backlight unit. Amorphous silicon (a-Si:H) thin film transistors (TFT) that include a semiconductor layer of amorphous silicon are widely used as switching elements because the amorphous silicon thin film can be formed on a large-sized insulating substrate such as a glass substrate under a low temperature. However, even though TFT-LCDs using amorphous silicon TFTs have an advantage over CRTs of low power consumption, the price of TFT-LCDs is higher than that of CRTs because TFT-LCDs require an expensive driving circuit.

FIG. 1 is a schematic plane view of an amorphous silicon thin film transistor liquid crystal display device according to the related art.

In FIG. 1, a substrate 10 includes a display region "D." A gate driving integrated circuit (IC) 20 and a data driving IC 30 are formed between the display region "D" and a printed circuit board (PCB) 40. Generally, the gate and data driving ICs 20 and 30, which are referred to as a large scale integration (LSI), are fabricated by using single crystalline silicon and connected to the substrate by a tape automated bonding (TAB) method. However, as the resolution of the liquid crystal display (LCD) device increases, more leads are necessary to connect the substrate and the driving LSI. For example, in a super extended graphic array (SXGA) display having 1280×1024×3 pixels, at least 1280×3×1024 leads are required for connection. The process for fabricating large numbers of leads is complex, thereby reducing reliability and production yield. Moreover, the price of LCD devices increases due to the expensive driving LSI. To solve these problems, LCD devices using a polycrystalline silicon thin film transistor are suggested.

FIG. 2 is a schematic plane view of a polycrystalline silicon thin film transistor liquid crystal display device according to the related art.

In FIG. 2, a substrate 10 includes a display region "D." Contrary to LCD devices using an amorphous silicon thin film transistor, a gate driving circuit 22 and a data driving circuit 32 of the LCD device of FIG. 2 are directly formed on the substrate 10 using a polycrystalline silicon as a switching element of each pixel (not shown). Accordingly, an additional process of connecting the substrate and a driving LSI is not necessary.

FIG. 3 is a schematic cross-sectional view of a polycrystalline silicon thin film transistor according to the related art.

In FIG. 3, a first insulating layer (a buffer layer) 40 is formed on a substrate 10 and an active layer 42 of polycrystalline silicon is formed on the first insulating layer 40. A second insulating layer (a gate insulating layer) 44 is formed on the active layer 42 and a gate electrode 46 is formed on the second insulating layer 44 over the active layer 42. A third insulating layer (an interlayer insulating layer) 48 having contact holes is formed on the gate electrode 46. Source and drain electrodes 50a and 50b are formed on the third insulating layer 48 and connected to the active layer 46 through the contact holes. A fourth insulating layer (a passivation layer) 52 is formed on the source and drain electrodes 50a and 50b. A pixel electrode 54 is formed on the fourth insulating layer 52 and connected to the drain electrode 50b.

FIG. 4 is a schematic perspective view of a liquid crystal display device according to the related art.

In FIG. 4, first and second substrates face into and are spaced apart from each other, and a liquid crystal layer is interposed therebetween. The first substrate having a thin film transistor (TFT) "T" and array lines, and the second substrate having a black matrix and a color filter layer are fabricated through various process steps. Among the various process steps, a process for stabilizing the TFT "T" may be performed for the first substrate having the TFT "T" or for the attached first and second substrates, i.e. for a cell having the TFT "T."

When a polycrystalline silicon (p-Si) TFT-LCD device is driven for a long period of time under room temperature, carriers generated at a P-N (positive-negative) junction of the p-Si TFT produce an OFF-current ($I_{OFF}$) may leave residual images on the LCD device panel which can degrade the LCD device. Accordingly, a stabilizing process is performed in which an OFF-state stress is applied to the P-type TFT to prevent the residual images. To apply an OFF-state stress means to apply a voltage opposite to or different from a normal voltage. Through this stabilizing process, the OFF-current may be reduced and a mobility of the TFT may be improved.

FIG. 5 is a schematic circuit diagram illustrating one pixel of a liquid crystal display device according to the related art.

In FIG. 5, a P-type thin film transistor (P-TFT) is formed in each pixel region. A gate electrode and a source electrode of the P-TFT are connected to a gate line 12 and a data line 14, respectively. A drain electrode of the P-TFT is connected to a storage capacitor "$C_{ST}$" and a liquid crystal capacitor "$C_{LC}$." The storage capacitor "$C_{ST}$" is connected to a common line 16, and the liquid crystal capacitor "$C_{LC}$" is connected to the common electrode 18.

FIGS. 6A and 6B are a schematic circuit diagram and a timing chart, respectively, illustrating a stabilizing method including a first OFF-state stress applied to a liquid crystal display device according to the related art.

In FIGS. 6A and 6B, when a low gate voltage (for example, −10V) is applied to a gate electrode of a P-TFT through a gate line 12, the P-TFT is turned ON. Since a low data voltage (for example, −10V) is applied to a source electrode of the P-TFT through a data line 14, the low data voltage is also applied to a drain electrode of the P-TFT. After the low data voltage is applied to the drain electrode of the P-TFT, a high gate voltage (for example, 30V) is applied to the gate electrode of the P-TFT, thereby turning OFF the P-TFT. Then, a high data voltage (for example, 0V) is applied to the source electrode of the P-TFT. Since the drain electrode maintains the low data voltage and the P-TFT maintains a turn-OFF state, a first OFF-state stress including the high gate voltage of the gate electrode, the high data voltage of the source electrode and the low data voltage of the drain electrode is obtained as a forward bias mode.

FIG. 6C is a schematic cross-sectional view illustrating an effect of a first OFF-state stress of a stabilizing method according to the related art.

In FIG. 6C, since a voltage difference (for example, 40V) between a gate electrode and a drain electrode is higher than that between the gate electrode and a source electrode, an electric field between the gate electrode and the drain electrode is higher and becomes dominant. Accordingly, electrons adjacent to the drain electrode are accelerated by the electric field and captured by an interface of a polycrystalline silicon layer and a trap in the polycrystalline silicon grain boundary. The captured electrons cure the interface and the trap of the polycrystalline silicon layer adjacent to the drain electrode.

FIG. 6D is a current-voltage (I-V) curve illustrating an OFF-current of a P-TFT after a first OFF-state stress of a stabilizing method according to the related art.

In FIG. 6D, an OFF-current of a P-TFT is improved after a first OFF-state stress is applied to the P-TFT because defects of the P-TFT are cured.

FIGS. 7A and 7B are a schematic circuit diagram and a timing chart illustrating a stabilizing method including a second OFF-state stress applied to a liquid crystal display device according to the related art, respectively.

In FIGS. 7A and 7B, when a low gate voltage (for example, -10V) is applied to a gate electrode of a P-TFT through a gate line 12, the P-TFT is turned ON. Since a high data voltage (for example, 0V) is applied to a source electrode of the P-TFT through a data line 14, the high data voltage is also applied to a drain electrode of the P-TFT. After the high data voltage is applied to the drain electrode of the P-TFT, a high gate voltage (for example, 30V) is applied to the gate electrode of the P-TFT, thereby turning OFF the P-TFT. Then, a low data voltage (for example, -10V) is applied to the source electrode of the P-TFT. Since the drain electrode maintains the high data voltage and the P-TFT maintains a turn-OFF state, a second OFF-state stress including the high gate voltage of the gate electrode, the low data voltage of the source electrode and the high data voltage of the drain electrode is obtained as a reverse bias mode.

FIG. 7C is a schematic cross-sectional view illustrating an effect of a second OFF-state stress of a stabilizing method according to the related art.

In FIG. 7C, since a voltage difference (for example, 40V) between a gate electrode and a source electrode is higher than that between the gate electrode and a drain electrode, an electric field between the gate electrode and the source electrode is higher and becomes dominant. Accordingly, electrons adjacent to the source electrode are accelerated by the electric field and captured by an interface of a polycrystalline silicon layer and a trap in the polycrystalline silicon grain boundary. The captured electrons cure the interface and the trap of the polycrystalline silicon layer adjacent to the source electrode.

FIG. 7D is a current-voltage (I-V) curve illustrating an OFF-current of a P-TFT after a second OFF-state stress of a stabilizing method according to the related art.

In FIG. 7D, an OFF-current of a P-TFT is improved after a second OFF-state stress is applied to the P-TFT because defects of the P-TFT are cured. Moreover, an ON-current is also improved.

In a stabilizing method including an OFF-state stress, a gate voltage having two values and a data voltage having two values are used to improve a P-TFT property by reducing an OFF-current. However, since forward and reverse modes are alternated, the stabilizing method is complex. Moreover, when many LCD cells are fabricated in one substrate, the stabilizing method is performed for each LCD cell. Accordingly, it takes much time to perform the stabilizing method, thereby reducing production yield.

SUMMARY OF THE INVENTION

Accordingly, the present invention is directed to an apparatus for applying an OFF-state stress to a liquid crystal display device that substantially obviates one or more of the problems due to limitations and disadvantages of the related art.

An advantage of the present invention is that it provides an apparatus for applying an OFF-state stress to a p-type thin film transistor to improve OFF-current and mobility.

Another advantage of the present invention is that it provides an apparatus for applying an OFF-state stress to a plurality of cells at the same time so as to improve production yield.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, an apparatus for applying an OFF-state stress to a P-MOS device of one of an array substrate for an LCD device and an LCD panel having attached substrates includes: a power supply unit supplying a source power; a panel loading unit including a plurality of panel jigs on which one of the array substrate and the LCD panel is loaded; a voltage control unit including a plurality of voltage control channels and modulating a voltage of the source power; a frequency control unit including a plurality of frequency control channels and modulating a frequency of the source power; a time setting unit determining a time period of supplying the source power; and a panel selecting unit including a plurality of panel selecting channels and modulating an application of the source power.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, example of which is illustrated in the accompanying drawings. Wherever possible, similar reference numbers will be used throughout the drawings to refer to the same or like parts.

Figure 1:
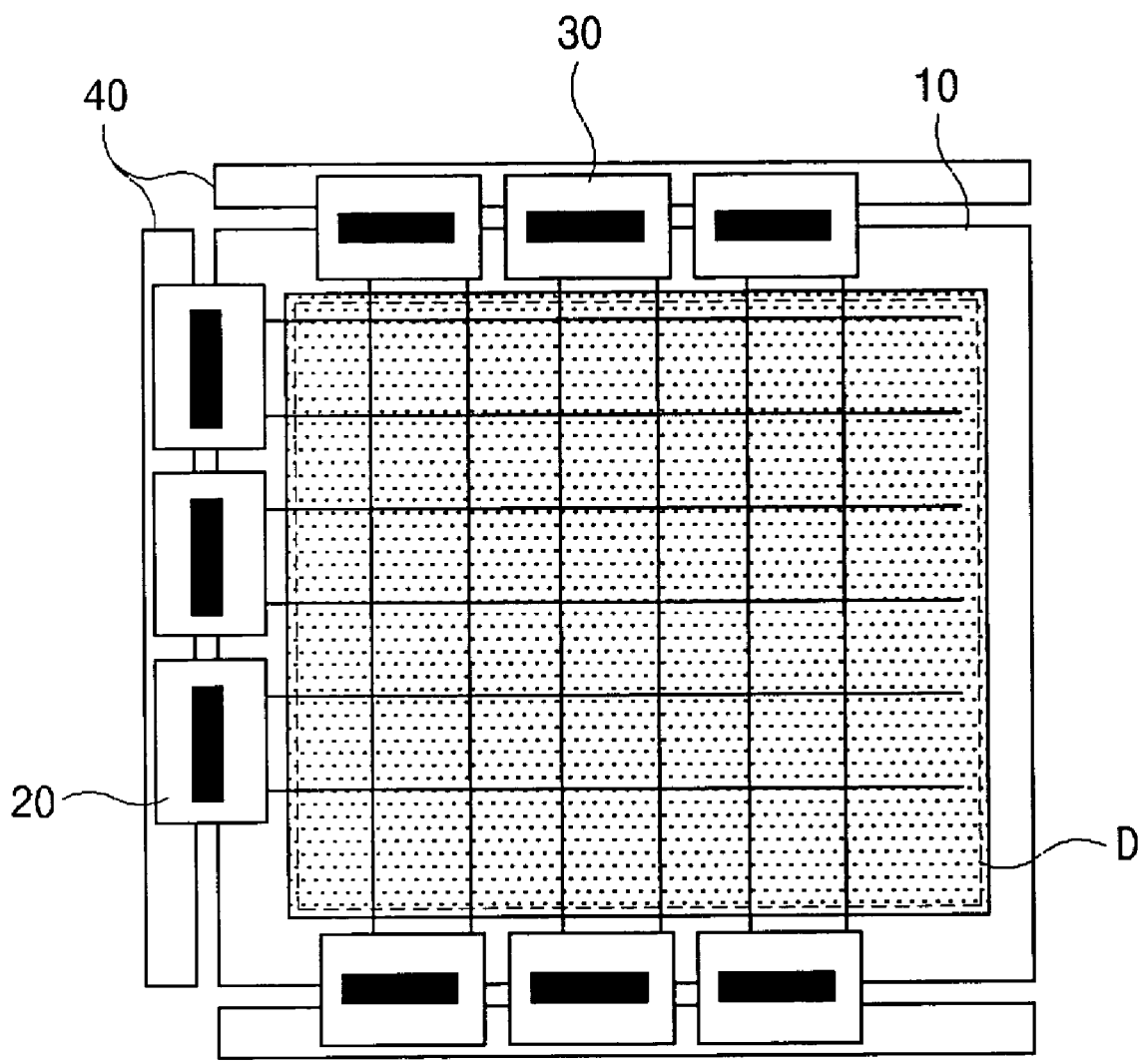
FIG. 1 is a schematic plane view of an amorphous silicon thin film transistor liquid crystal display device according to the related art.
Figure 2:
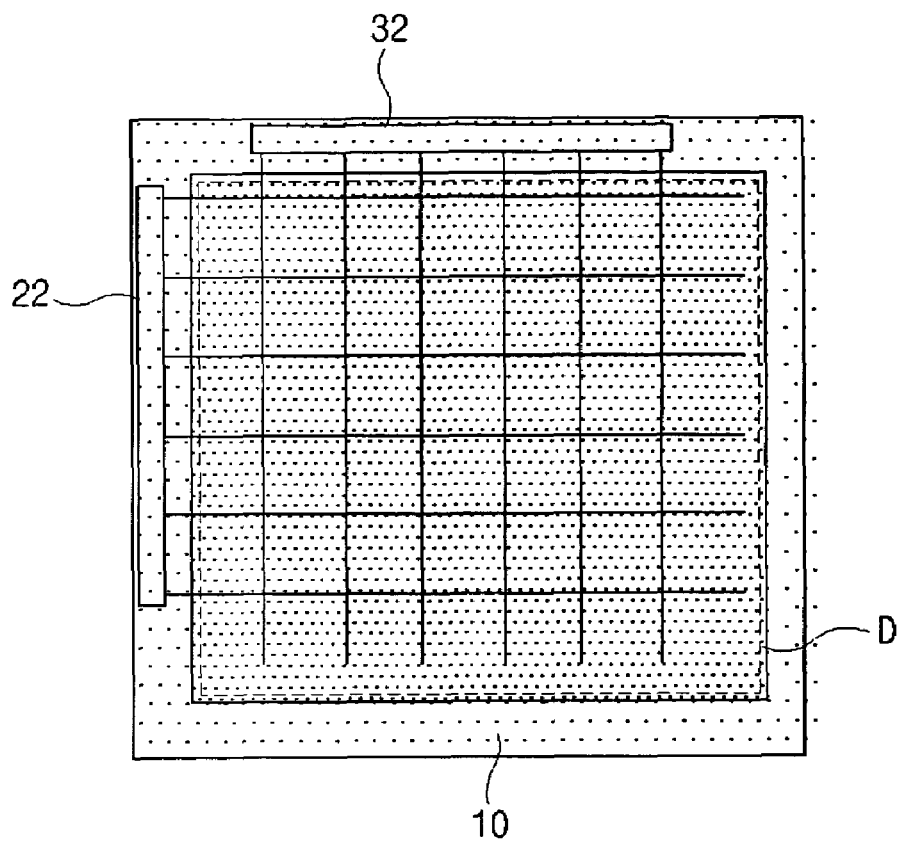
FIG. 2 is a schematic plane view of a polycrystalline silicon thin film transistor liquid crystal display device according to the related art.
Figure 3:
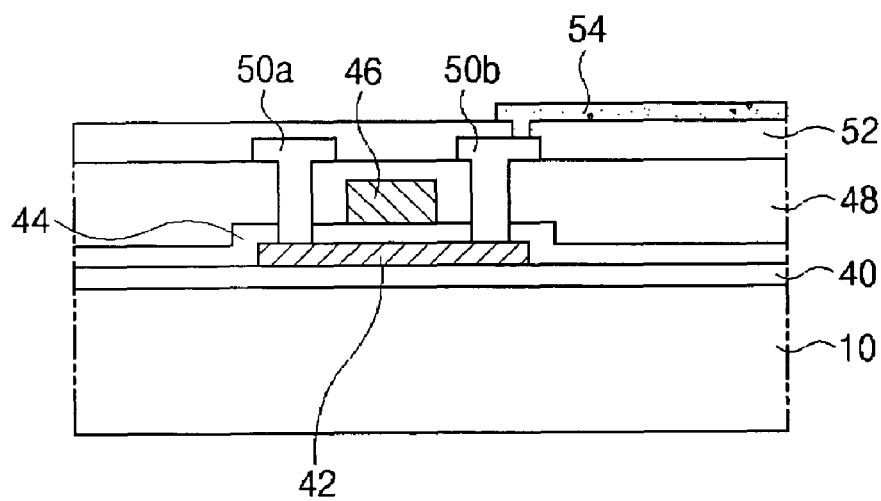
FIG. 3 is a schematic cross-sectional view of a polycrystalline silicon thin film transistor according to the related art.
Figure 4:
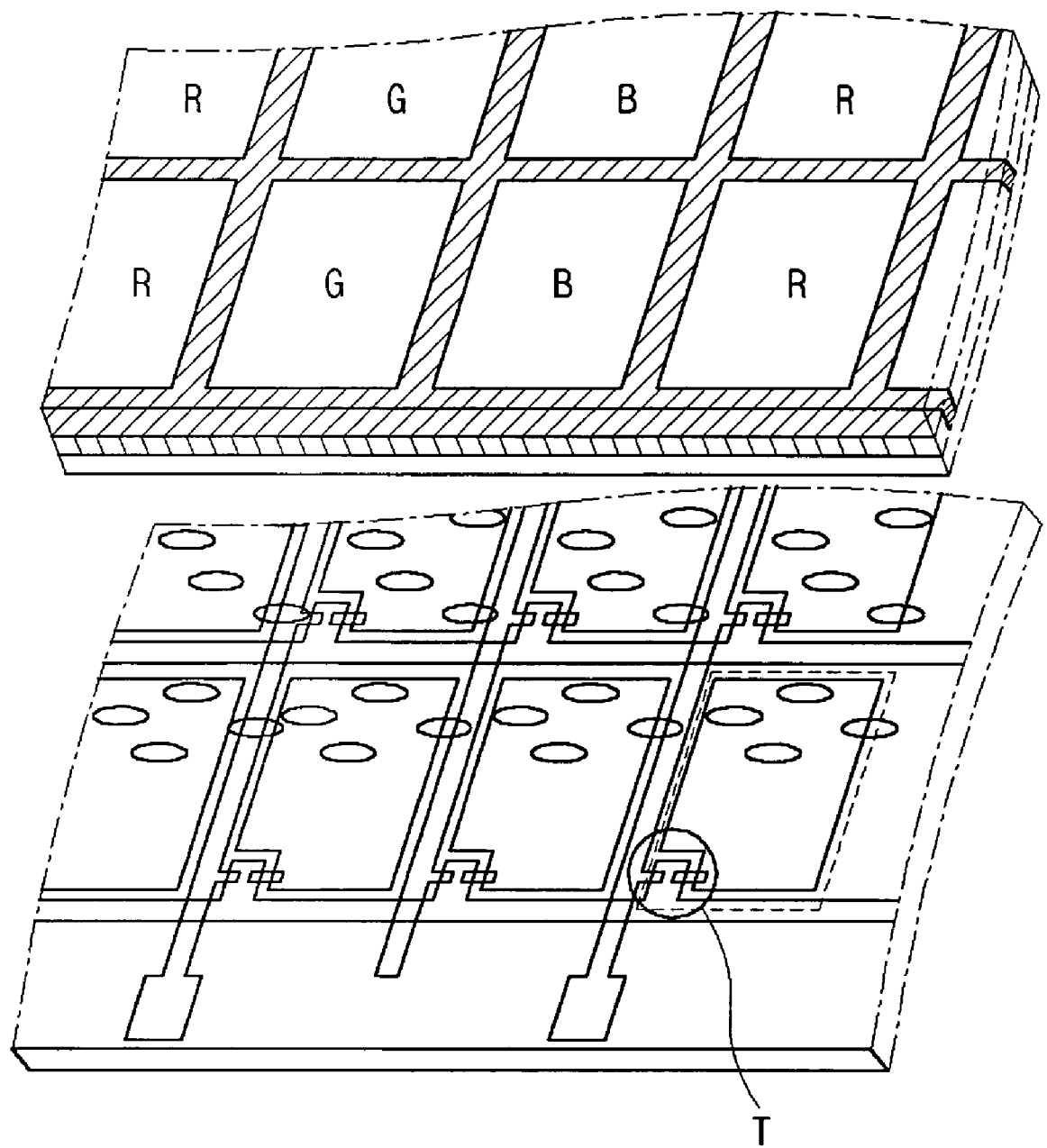
FIG. 4 is a schematic perspective view of a liquid crystal display device according to the related art.
Figure 5:
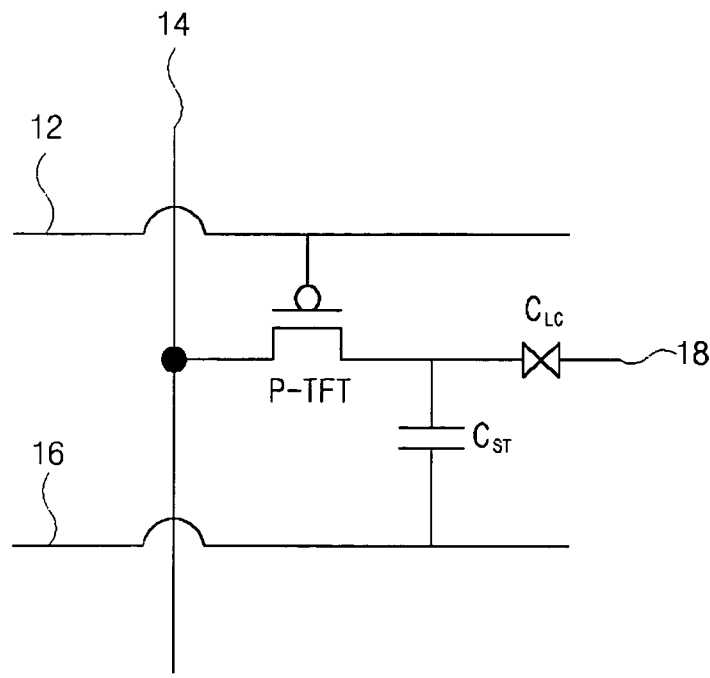
FIG. 5 is a schematic circuit diagram illustrating one pixel of a liquid crystal display device according to the related art.
Figure 6A:
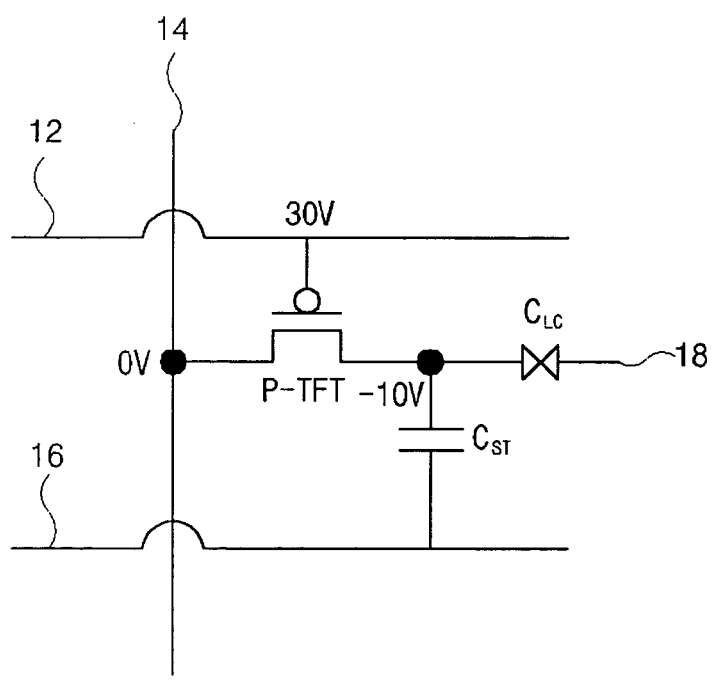
FIG. 6A is a schematic circuit diagram illustrating a stabilizing method including a first OFF-state stress applied to a liquid crystal display device according to the related art.
Figure 6B:
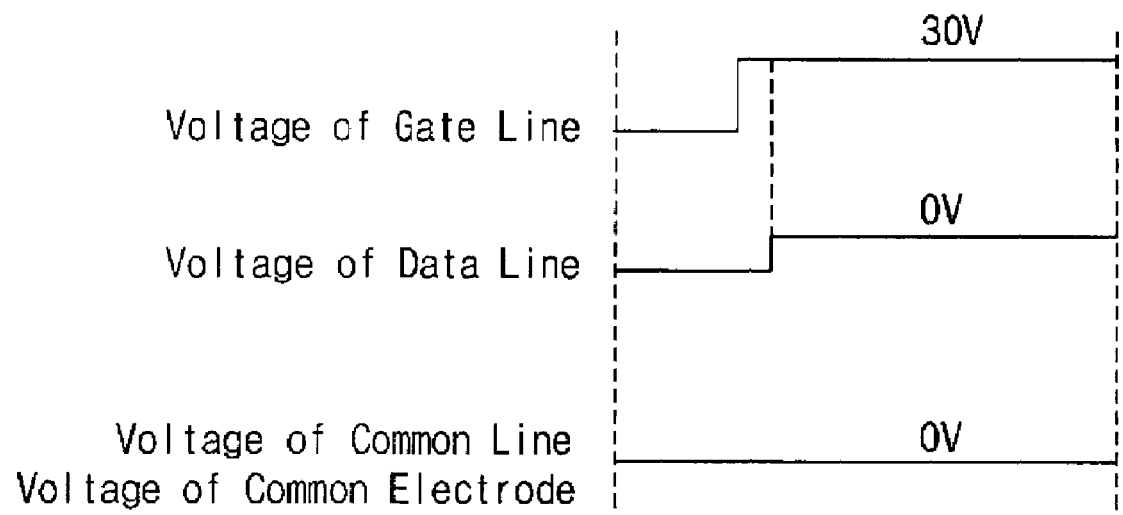
FIG. 6B is a timing chart illustrating a stabilizing method including a first OFF-state stress applied to a liquid crystal display device according to the related art.
Figure 6C:
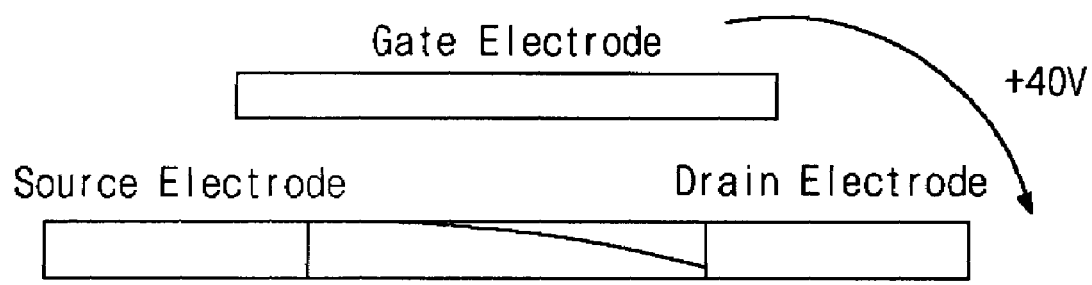
FIG. 6C is a schematic cross-sectional view illustrating an effect of a first OFF-state stress of a stabilizing method according to the related art.
Figure 6D:
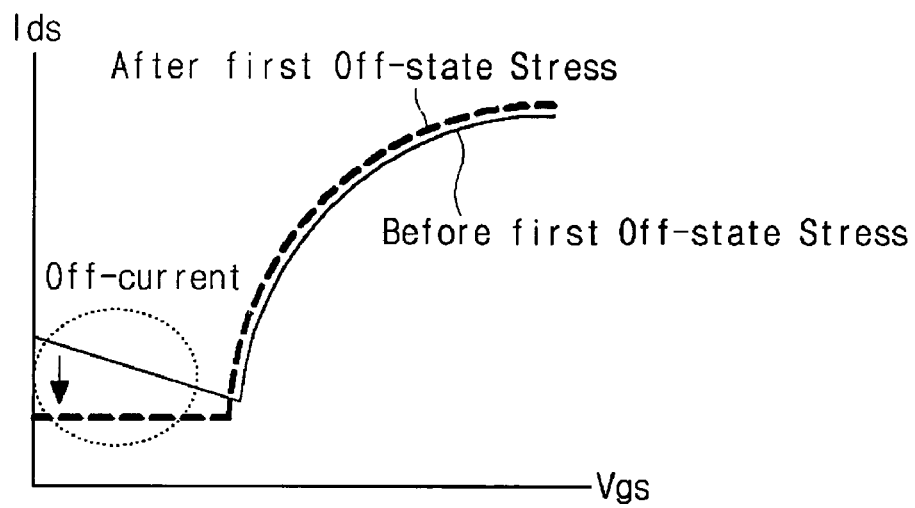
FIG. 6D is a current-voltage (I-V) curve illustrating an OFF-current of a P-TFT after a first OFF-state stress of a stabilizing method according to the related art.
Figure 7A:
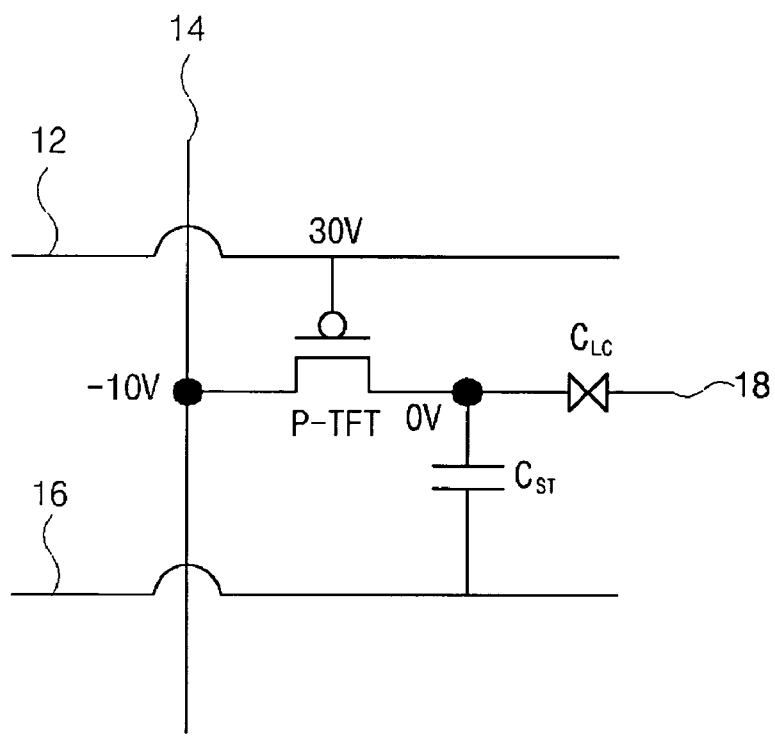
FIG. 7A is a schematic circuit diagram illustrating a stabilizing method including a second OFF-state stress applied to a liquid crystal display device according to the related art.
Figure 7B:
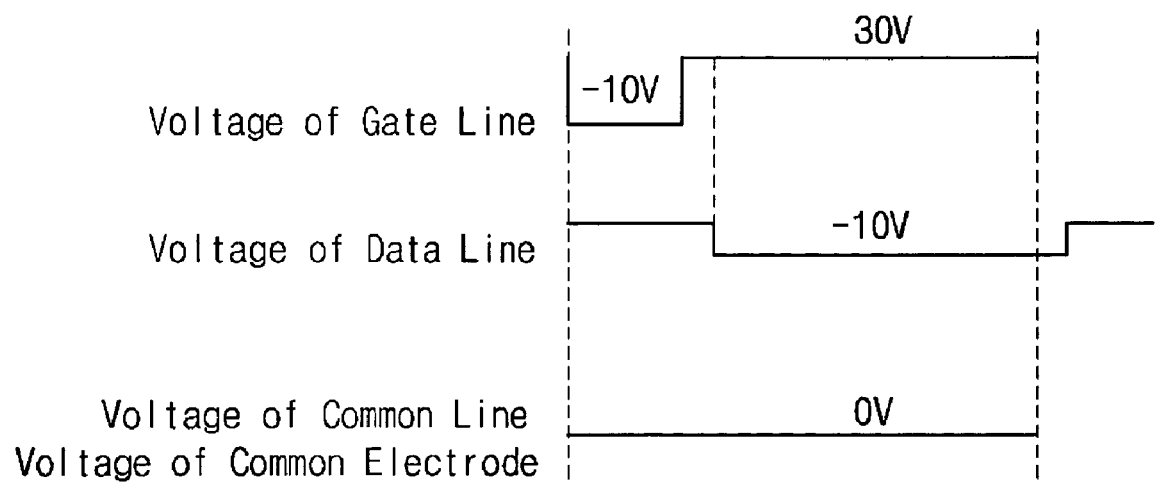
FIG. 7B is a timing chart illustrating a stabilizing method including a second OFF-state stress applied to a liquid crystal display device according to the related art.
Figure 7C:
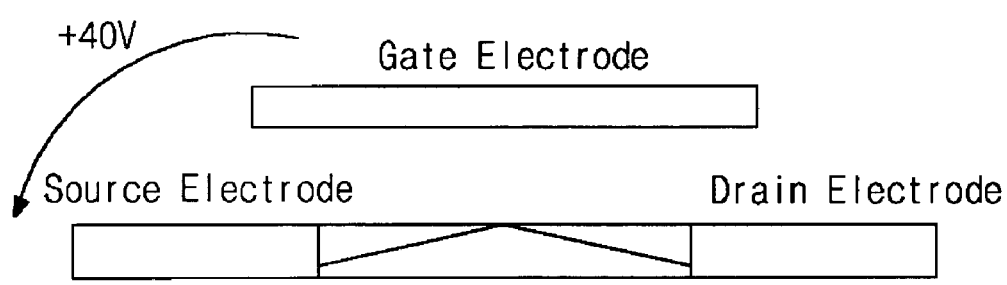
FIG. 7C is a schematic cross-sectional view illustrating an effect of a second OFF-state stress of a stabilizing method according to the related art.
Figure 7D:
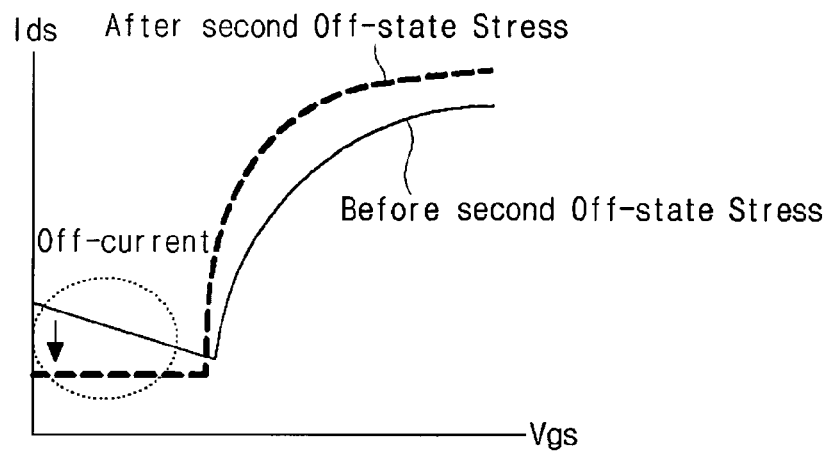
FIG. 7D is a current-voltage (I-V) curve illustrating an OFF-current of a P-TFT after a second OFF-state stress of a stabilizing method according to the related art.
Figure 8A:
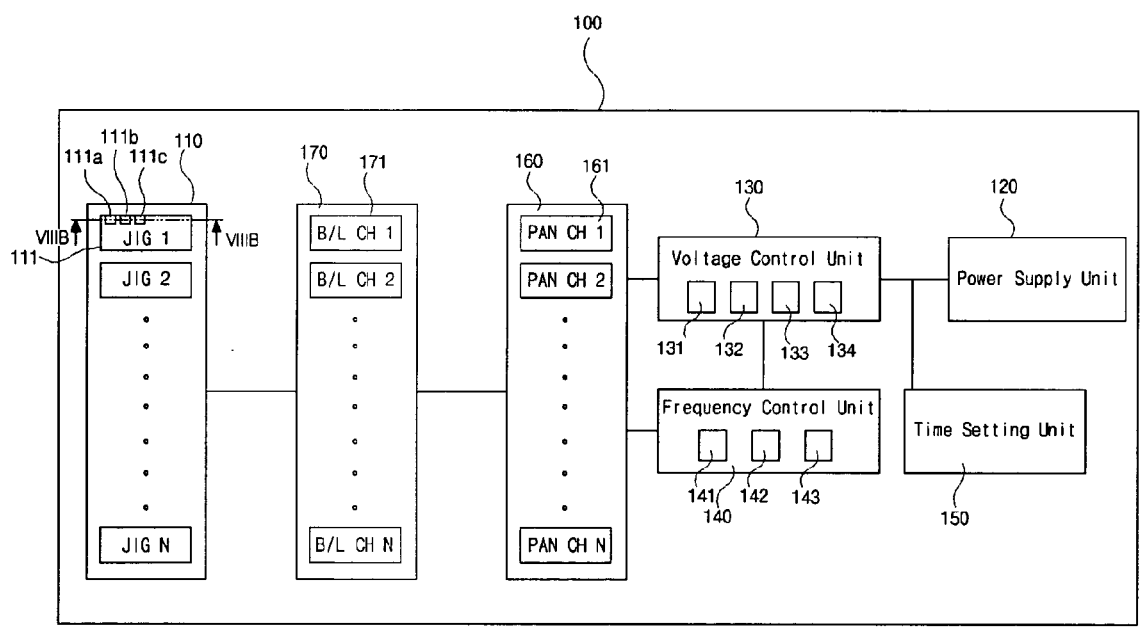
FIG. 8A is a schematic block diagram illustrating an apparatus for applying an OFF-state stress according to an embodiment of the present invention.
Figure 8B:
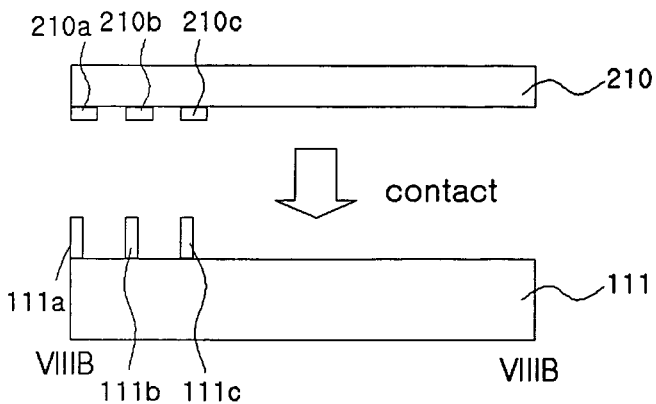
FIG. 8B is a schematic cross-sectional view taken along a line "VIIIB—VIIIB" of FIG. 8A.

FIG. 8A is a schematic block diagram illustrating an apparatus for applying an OFF-state stress according to an embodiment of the present invention and FIG. 8B is a schematic cross-sectional view taken along a line "VIIIB—VIIIB" of FIG. 8A.

In FIGS. 8A and 8B, an apparatus for applying an OFF-state stress includes a power supply unit 120, a panel loading unit 110, a voltage control unit 130, a frequency control unit 140, a time setting unit 150, a panel selecting unit 160, and a backlight selecting unit 170. The power supply unit 120 applies a source power, and the panel loading unit 110 includes panel jigs 111. An array substrate for an LCD device or an LCD panel 210 including attached substrates is loaded on each panel jig 111, and each panel jig 111 has a plurality of power input terminals 111a, 111b and 111c through which the source power is applied to the array substrate or the LCD panel 210. The voltage control unit 130 includes a plurality of voltage control channels 131, 132 and 133 that modulate a voltage of the source power and supply the voltage-modulated source power to the plurality of power input terminals 111a, 111b and 111c. The frequency control unit 140 modulates a frequency of the source power. The time setting unit 150 sets a time period for supplying the source power. The panel selecting unit 160 includes a plurality of panel selecting channels 161 that control supplying the source power to each panel jig 111. The backlight selecting unit 170 includes a plurality of backlight selecting channels 171 that control supplying a backlight source power to each panel jig 111.

Figure 9:
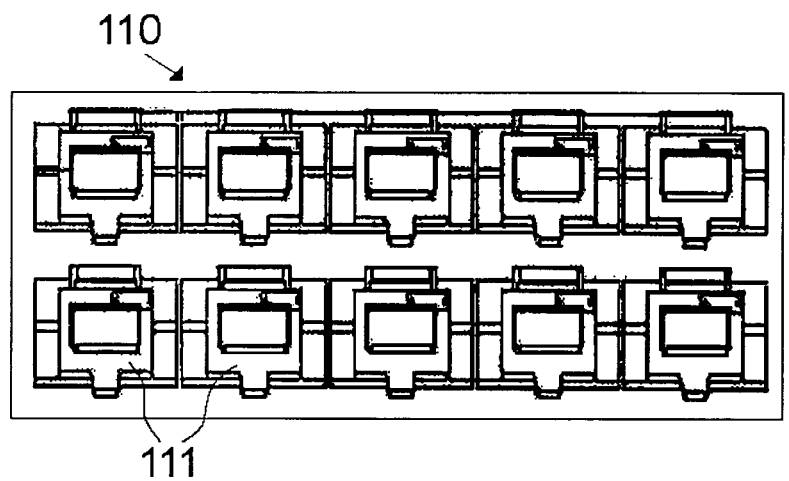
FIG. 9 is a schematic block diagram illustrating a panel loading unit of an apparatus for applying an OFF-state stress according to an embodiment of the present invention.

FIG. 9 is a schematic block diagram illustrating a panel loading unit of an apparatus for applying an OFF-state stress according to an embodiment of the present invention.

In FIG. 9, a panel loading unit 110 includes a plurality of panel jigs 111. An array substrate for an LCD device or an LCD panel 210 (see FIG. 8A) may be loaded on each panel jig 111. Each panel jig 111 can be replaced on the panel loading unit 110 according to a size of the LCD device, for example, 3.7 inch, 4 inch and 4.6 inch, etc. In addition, each panel jig 111 includes first to third power input terminals 111a to 111c (see FIG. 8). A source power is applied to a gate line through the first power input terminal 111a and applied to a data line through the second power input terminal 111b. The source power is applied to a common line and a common electrode through the third power input terminal 111c. When the array substrate or the LCD panel 210 is loaded on the panel jig 111, the first, second and third power input terminals 111a, 111b and 111c contact a gate pad 210a (see FIG. 8B) connected to the gate line, a data pad 210b (see FIG. 8B) connected to the data line and a common pad 210c (see FIG. 8B) connected to the common line and the common electrode, respectively. The first to third power input terminals 111a, 111b and 111c can be disposed at a specific position according to a position of pads 210a, 210b and 210c of the array substrate or the LCD panel 210.

Figure 10A:
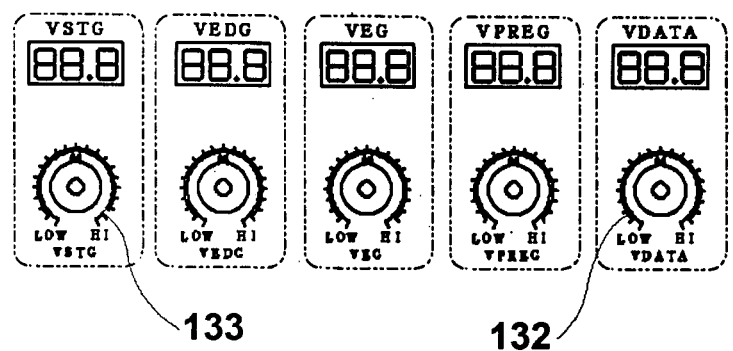
FIG. 10A is a schematic block diagram illustrating a plurality of voltage control channels of a voltage control unit of an apparatus for applying an OFF-state stress according to an embodiment of the present invention.
Figure 10B:
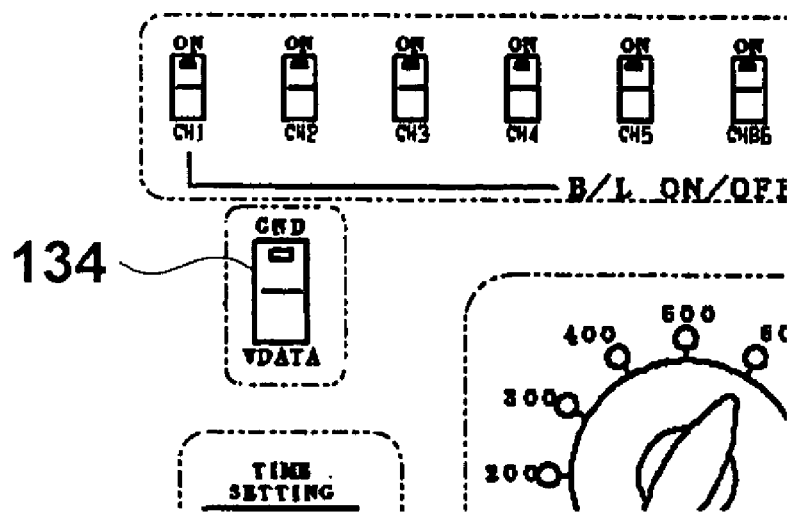
FIG. 10B is a schematic block diagram illustrating a data terminal ground channel of a voltage control unit of an apparatus for applying an OFF-state stress according to an embodiment of the present invention.

FIG. 10A is a schematic block diagram illustrating a plurality of voltage control channels of a voltage control unit of an apparatus for applying an OFF-state stress according to an embodiment of the present invention. FIG. 10B is a schematic block diagram illustrating a data terminal ground channel of a voltage control unit of an apparatus for applying an OFF-state stress according to an embodiment of the present invention.

The voltage control unit of FIGS. 10A and 10B may include a gate voltage control channel 131 (of FIG. 8), a data voltage control channel 132, a common voltage control channel 133, a data terminal ground channel 134 and a monitor indicating an modulated value of voltage. The gate voltage control channel 131 (of FIG. 8) modulates and supplies a gate voltage to a gate pad through a first power input terminal 111a (of FIG. 8) of a panel jig 111 (of FIG. 8). The data voltage control channel 132 modulates and supplies a data voltage to a data pad through a second power input terminal 111b (of FIG. 8). The common voltage control channel 133 modulates and supplies a common voltage to a common pad through a third power input terminal 111c (of FIG. 8). The data terminal ground channel 134 keeps a voltage of a pad grounded. The voltage control unit may further include additional voltage control channels according to a kind of source power supplied to the panel jig 111 (of FIG. 8) and application.

Referring again to FIG. 8, the frequency control unit 140 includes a gate frequency control channel 141, a data frequency control channel 142 and a common frequency control channel 143 to modulate a frequency of an AC (alternating current) voltage supplied to each of the plurality of power input terminals 111a, 111b and 111c of the panel jig 111 through each of the plurality of voltage control channels 131, 132 and 133 of the voltage control unit 130. The gate frequency control channel 141 modulates a frequency of a gate voltage supplied through a gate voltage control channel 131; and the data frequency control channel 142 modulates a frequency of a data voltage supplied through a data voltage control channel 132. The common frequency control channel 141 modulates a frequency of a common voltage supplied through a common voltage control channel 133. Therefore, each of the gate voltage, the data voltage and the common voltage becomes an AC voltage having a frequency, i.e., a pulse by the frequency control unit 140 and then supplied to the plurality of power input terminals 111a, 111b and 111c. The time setting unit 150 functions as a timer for setting a time period of supplying the source power through the voltage control unit 130.

Figure 11:
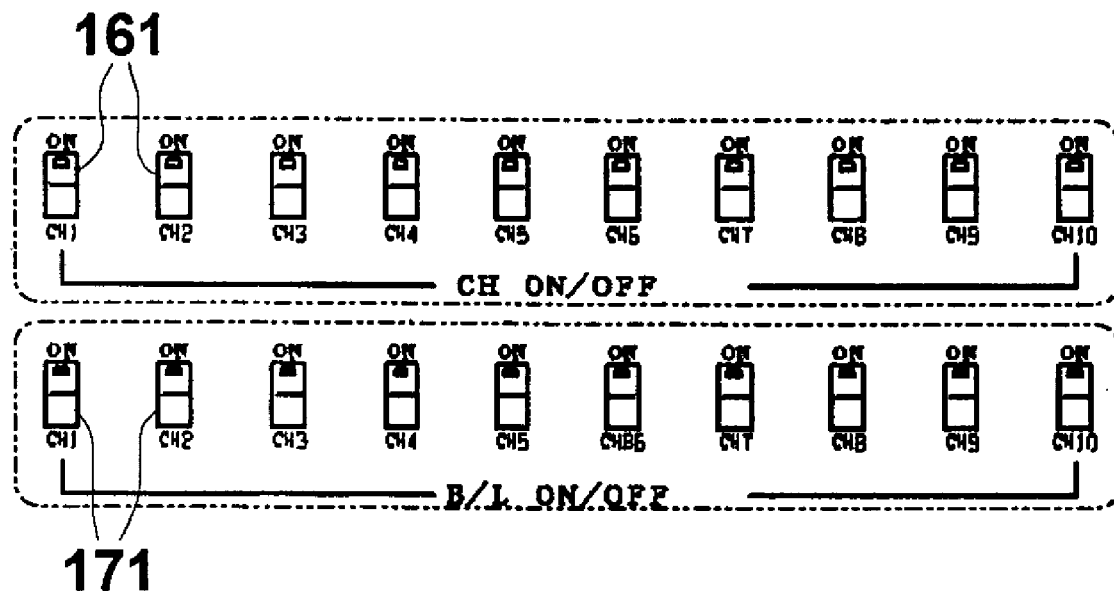
FIG. 11 is a schematic block diagram illustrating a panel selecting unit and a backlight selecting unit of an apparatus for applying an OFF-state stress according to an embodiment of the present invention.

FIG. 11 is a schematic block diagram illustrating a panel selecting unit and a backlight selecting unit of an apparatus for applying an OFF-state stress according to an embodiment of the present invention.

In FIG. 11, a panel selecting unit 160 determines one panel jig 111 to which a source power is supplied. The panel selecting unit 160 includes a plurality of panel selecting channels 161 functioning as an ON/OFF switch and corresponding to the plurality of panel jigs 111. The backlight selecting unit 170 also determines one panel jig 111 to which a backlight source power is supplied. As a result, the backlight selecting unit 170 includes a plurality of backlight selecting channels 171 functioning as an ON/OFF switch and corresponding to the plurality of panel jigs 111.

An operation of an apparatus for applying an OFF-state stress will be illustrated.

Referring again FIG. 8, an array substrate for an LCD device or an LCD panel is loaded on one panel jig 111. First, second and third power input terminals 111a, 111b and 111c of the panel jig 111 are connected to a gate pad, a data pad and a common pad of the array substrate or the LCD panel, respectively. Next, a source power including a gate voltage, a data voltage and a common voltage is supplied from a power supply unit 120. A gate voltage control channel 131, a data voltage control channel 132 and a common voltage control channel 133 of a voltage control unit 130 modulate a voltage of the source power, and a data terminal ground channel 134 determines whether the data pad is grounded or not. After modulating the voltage of the source power, a frequency control unit 140 adds an AC voltage to the voltage-modulated source power through a frequency control channel. Next, after selecting a panel jig 111, a panel selecting channel 161 of a panel selecting unit 160 is turned ON. When an LCD panel is loaded on the panel jig 111, a backlight selecting channel 171 of a backlight selecting unit 170 may be turned ON to supply a backlight source power for testing a backlight unit. Next, after setting a time period of supplying the source power, a stabilization process for a P-TFT is performed by applying an OFF-state stress.

Since an apparatus for applying an OFF-state stress to a P-TFT uses an AC voltage, the apparatus has a simpler structure and an higher stabilization effect. Accordingly, residual images can be reduced by an OFF-current reduction. Moreover, since the apparatus performs the stabilization process for a plurality of panels at the same time by expansion of panel jigs, production yield can be improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A liquid crystal display (LCD) device loading unit comprises:
   at least one panel jig for holding a LCD device, said LCD having a gate pad, data pad, common pad, and at least one P-MOS device;
   said panel jig including first, second and third power input terminals;
   said first power input terminal corresponding to said gate pad, said second power input terminal corresponding to said data pad, and said third power input terminal corresponding to said common pad;
   said first, second, and third power input terminals contacting said gate, data, and common pads, respectively, when said LCD device is loaded into said panel jig; and
   said panel jig supplying an OFF-state stress to said P-MOS device of said LCD device via said first, second, and third power input terminals and said gate, data, and common pads.

2. The liquid crystal display (LCD) device loading unit of claim 1 further comprising:
   a plurality of said panel jigs, each of said panel jigs having first, second, and third power input terminals.

3. The liquid crystal display (LCD) device loading unit of claim 1, wherein the position of the first, second, and third power input terminals on the panel jig corresponds to the position of the gate, data, and common pads on the LCD device.

4. The liquid crystal display (LCD) device loading unit of claim 2, wherein an OFF-state stress is applied simultaneously to a plurality of LCD panels loaded into panel jigs.

5. The liquid crystal display (LCD) device loading unit of claim 1, wherein said LCD device includes a backlight unit; and p1 said panel jig includes a backlight power terminal for supplying power to the backlight unit of said LCD device.

6. An apparatus for applying an OFF-state stress to a P-MOS device of a liquid crystal display (LCD) device, comprising:
   a power supply unit for supplying a source power;
   a panel loading unit including a plurality of panel jigs on which one of the array substrate and an LCD panel is loaded;
   a voltage control unit including a plurality of voltage control channels and modulating a voltage of the source power;
   a frequency control unit including a plurality of frequency control channels and modulating a frequency of the source power;
   a time setting unit for controlling a time period of supplying the source power; and
   a panel selecting unit including a plurality of panel selecting channels and modulating an application of the source power.

7. The apparatus according to claim 6, further comprising a backlight selecting unit for modulating an application of a backlight source power to the panel loading unit.

8. The apparatus according to claim 6, wherein each of the array substrate and the LCD panel includes a gate pad connected to a gate line, a data pad connected to a data line and a common pad connected to a common line and a common electrode.

9. The apparatus according to claim 8, wherein the source power includes a gate voltage, a data voltage and a common voltage.

10. The apparatus according to claim 9, wherein each of the panel jigs has a plurality of power input terminals applying the source power to one of the array substrate and the LCD panel loaded thereon.

11. The apparatus according to claim 10, wherein the plurality of power input terminals include first, second, and third power input terminals, wherein the first power input terminal applies the gate voltage to the gate pad, wherein the second power input terminal applies the data voltage to the data pad, wherein the third power input terminal applies the common voltage to the common pad.

12. The apparatus according to claim 9, wherein the plurality of voltage control channels include a gate voltage control channel for modulating the gate voltage, a data voltage control channel modulating the data voltage, a common voltage control channel for modulating the common voltage and a data terminal ground channel for grounding the data pad.

13. The apparatus according to claim 9, wherein the plurality of frequency control channels include a gate frequency control channel for modulating a frequency of the gate voltage, a data frequency control channel for modulating a frequency of the data voltage, a common frequency control channel for modulating a frequency of the common voltage.

14. The apparatus according to claim 9, wherein said frequency control unit adds an AC voltage to the voltage-modulated source power.

15. A method for applying an OFF-state stress to a P-MOS device of a liquid crystal display (LCD) device, comprising:
    loading a plurality of array substrates for an LCD device into a plurality of jigs, each of said array substrates having a gate line, a data line, and a common line;
    applying a source power from a power supply unit to the gate line, data line, and common line of a plurality of the array substrates loaded into the jigs;
    modulating the source power voltage of the gate line, data line, and common line of each of the plurality of array substrates via a voltage control unit; and
    modulating the frequency of an AC voltage component of the voltage-modulated source power via a frequency control unit.

16. The method of claim 15, wherein at least one of said array substrates for an LCD device is housed in an LCD panel.

17. The method of claim 15, wherein an OFF-state stress is applied simultaneously to a plurality of the array substrates loaded into the jigs.

18. The method of claim 15, wherein
    said voltage control unit includes gate, data, and common voltage control channels; and
    wherein modulating the source power voltage of the gate line, data line, and common line comprises:
    modulating the source power voltage of the gate line via the gate voltage control channel;
    modulating the source power voltage of the data line via the data voltage control channel; and
    modulating the source power voltage of the common line via the common voltage control channel.

19. The method of claim 15, wherein
    said frequency control unit includes gate, data, and common frequency control channels; and
    wherein modulating the frequency of an AC voltage component of the voltage-modulated source power comprises:
    modulating the frequency of the AC voltage of the gate line via the gate frequency control channel;
    modulating the frequency of the AC voltage of the data line via the data frequency control channel; and
    modulating the frequency of the AC voltage of the common line via the common frequency control channel.

* * * * *